US005578864A

United States Patent [19]

Ochi et al.

[11] Patent Number: 5,578,864

[45] Date of Patent: Nov. 26, 1996

[54] SEMICONDUCTOR MATERIAL FOR USE IN THERMOELECTRIC CONVERSION, THERMOELECTRIC CONVERTING METHOD AND THERMOELECTRIC DEVICE

[75] Inventors: Yasuo Ochi; Kazuo Ohara, both of Sagamihara, Japan

[73] Assignee: Kabushiki Kaisha Ohara, Kanagawa, Japan

[21] Appl. No.: 515,008

[22] Filed: Aug. 14, 1995

[30] Foreign Application Priority Data

Aug. 26, 1994 [JP] Japan .................................... 6-202393

[51] Int. Cl.$^{6}$ .................................................. H01L 31/058

[52] U.S. Cl. .......................... 257/467; 257/470; 428/688; 428/697; 501/108; 501/126

[58] Field of Search .................................... 428/688, 697, 428/702; 501/108, 118, 123, 126; 252/62.3 R, 62.3 T, 62.3 ZB, 62.9 R, 62.9 PZ; 257/467, 470

[56] References Cited

U.S. PATENT DOCUMENTS

| | | | |
|---|---|---|---|
| 4,490,014 | 12/1984 | Levinson | 350/334 |
| 4,675,123 | 6/1987 | Tsunooka | 252/62.9 |
| 4,710,311 | 12/1987 | Ogawa | 252/62.9 |

*Primary Examiner*—Ellis Robinson
*Assistant Examiner*—Leonidas J. Jones
*Attorney, Agent, or Firm*—Oliff & Berridge

[57] ABSTRACT

A thermoelectric semiconductor material is disclosed. The material comprises a double oxide which contains antimony and has a trirutile crystal structure.

27 Claims, No Drawings

SEMICONDUCTOR MATERIAL FOR USE IN THERMOELECTRIC CONVERSION, THERMOELECTRIC CONVERTING METHOD AND THERMOELECTRIC DEVICE

BACKGROUND OF THE INVENTION

1. Field of the Invention

The present invention relates to a thermoelectric semiconductor material, in particular, to a thermoelectric material which is adapted to be used for a Peltier cooling element, an electric generating element, or the like, and which exhibits the Peltier effect in which a temperature difference is generated by using an electric energy or exhibits the Seebeck effect in which an electric energy is generated by using a temperature difference.

2. Description of Related Art

Thermoelectric performance of such a thermoelectric material which exhibits the Peltier effect or the Seebeck effect is evaluated by the figure of merit Z (dimension: $K^{-1}$) or power factor ($W/mK^2$) which is estimated by the following equations. The larger the value of the figure of merit Z becomes, the better the thermoelectric performance is.

$$Z=\alpha^2\sigma/\kappa$$

$$\text{Power factor}=\alpha^2\sigma$$

where, $\alpha$ is a Seebeck coefficient ($\mu V/K$), $\sigma$ is an electrical conductivity ($(\Omega m)^{-1}$), and $\kappa$ is a thermal conductivity (W/mK). Therefore, in order to obtain a thermoelectric material having a high thermoelectric performance, it is necessary to select a material having a large Seebeck-Coefficient $\alpha$, a large electrical conductivity $\sigma$, and a small thermal conductivity $\kappa$.

Generally, a metal material or a semiconductor material is known as a thermoelectric material. Because in a metal material, Wiedemann Franz's law holds, which says that the ratio of the electrical conductivity $\sigma$ to the thermal conductivity $\kappa$ at a temperature does not depend upon the kind of metal and therefore has a constant value in any kind of metal, there is little chance of obtaining a thermoelectric material having a high thermoelectric performance by selecting a specific kind of metal.

On the contrary, in semiconductor materials, the above described law does not necessarily hold, and it is possible to select a specific material having a large electrical conductivity $\sigma$ and a small thermal conductivity $\kappa$. Because the value of the Seebeck coefficient $\alpha$ of a semiconductor material is usually about ten to several hundreds times that of a metal material, there is a good chance of obtaining a thermoelectric material having a high thermoelectric performance. Therefore, various kinds of semiconductor materials have been developed as thermoelectric materials.

Transition silicide which is used for thermoelectric power generation at a high temperature, and chalcogenide which is used as a material for Peltier cooling, are representative thermoelectric semiconductor materials which were conventionally developed. In these materials, a chalcogenide material of $Bi_2Te_3$ system, e.g., $Bi_2Te_3$, $Sb_2Te_3$, PbTe, GeTe or the like, which is applied for a thermoelectric cooling device, usually presents the best thermoelectric performance near room temperature and has a high figure of merit Z more than $10^{-3}K^{-1}$.

However, thermoelectric performance of the above chalcogenide material of $Bi_2Te_3$ system is extremely deteriorated in lower and higher temperature ranges other than room temperature. In particular, because the value of the figure of merit Z is not more than about $10^{-4}K^{-1}$ at a temperature more than about 250° C. and oxidation and decomposition occur under a high temperature, it was impossible to use the above chalcogenide material in a wide temperature range.

Generally, semiconductor material other than the chalcogenide material of $Bi_2Te_3$ system could be used as a thermoelectric material in only a very narrow temperature range.

SUMMARY OF THE INVENTION

The present invention was developed in view of the above-described problems. An object of the present invention is to provide a thermoelectric semiconductor material which presents a good figure of merit Z in a wide temperature range, e.g., in the range of 100K (about −173° C.) to 1000K (about 727° C.), and which can be stably used.

In order to solve the above problem, the inventors considered that not only the electrical conductivity of a solid which defines the performance of a Peltier element but also the thermoelectric power are determined by the atom which is a crystal structure unit of the solid material and by the structure thereof, i.e., the bond length between cations, the coordinating angle, and the overlap of electron orbits which is defined by the three-dimensional arrangement of oxygen ligends and the like.

On the basis of the consideration, the inventors studied the crystal structure and the electronic structure which satisfy both the above described properties. As a result, the inventors had an idea that a trirutile structure, which is considered to be rutile chains which are normal chains sharing an edge of an octahedron and running along [110] and are connected to one another by the adjacent normal chains sharing an oxygen, and which are considered that free electrons or holes are transmitted in the conduction band which is formed by the s-orbit of the central ion in an oxygen octahedron, is effective as one of host oxide crystals.

Furthermore, the inventors earnestly studied and researched trirutile structure materials which exhibited electrical conductivity and Seebeck-Coefficient, and discovered that a double oxide having a composition represented by $MSb_2O_6$, wherein M was an element which might change into a divalent ion, was the best one of the thermoelectric conversion materials. The inventors found that Zn by which a spinel crystal structure could be easily formed was effective as the above element M.

Further, the inventors found that it was possible to control the concentration of free electrons or holes which came to be carriers, by adding a trace impurities into the host oxide crystal ($MSb_2O_6$) to substitute another impurity having a different valent number for Sb or M which might change into a divalent ion, in the host crystal, and consequently, the electrical conductivity and Seebeck-Coefficient of the material could be furthermore improved.

The present invention was developed on the basis of the above described knowledge. In accordance with one aspect of the present invention, the thermoelectric semiconductor material comprises a double oxide which contains antimony (Sb) and has a normal trirutile crystal structure.

The thermoelectric material may further contain at least one of magnesium (Mg) and zinc (Zn).

Further, the thermoelectric material may further contain 0.01–30.0 atomic % of at least one element selected from the group consisting of lithium (Li), sodium (Na), potassium (K), aluminium (Al), gallium (Ga), indium (In), yttrium (Y), lanthanum (La), germanium (Ge), tin (Sn), and bismuth (Bi), as a trace substitutive material.

The reason why it is desirable that the concentrations of the above trace substitutive materials are in the above described range is as follows.

The inventors examined the influence of changing the concentration of the trace substitutive materials on the property of the material. As a result, it is found that when the concentration is more than the upper limit or less than the lower limit, the specific resistance of the obtained material increases, so that it is difficult to make semiconductor material in the air.

In order to obtain a further excellent electrical conductivity, it is preferable that the concentrations of the above trace substitutive materials are not more than 10.0 atomic %, more preferably not more than 5.0 atomic %.

Because the thermoelectric semiconductor material of the present invention comprises a double oxide which contains antimony and has a trirutile structure, the thermoelectric semiconductor material not only presents a large figure of merit Z or a large power factor at a temperature larger than the room temperature, but presents a high performance with a good reproducibility in the range of 100K to 1000K, and has a thermoelectric property which is excellent and stable in a wide temperature range.

When the double oxide contains at least one of magnesium and zinc, the double oxide can be prepared by a usual sintering method. Since the method does not require a specific atmosphere and the temperature required for sintering the double oxide is relatively low, i.e., not more than 1200° C., in comparison with that of another ceramics, it is possible to easily form the double oxide.

When the thermoelectric material of the present invention contain at least one element selected from the group consisting of lithium, sodium, potassium, aluminium, gallium, indium, yttrium, lanthanum, germanium, tin, and bismuth, as a trace substitutive material, a donor level or an acceptor level is formed, so that it is possible to control the concentration of free electrons or holes which come to be carriers. Accordingly, it is possible to control the electrical conductivity and the thermoelectric power of the material.

DETAILED DESCRIPTION OF THE INVENTION

Hereinafter, an embodiment of a thermoelectric semiconductor according to the present invention will be explained.

In the following embodiments, each sample was prepared by a usual sintering process, in which a mixed powder comprising predetermined kinds of raw powder material was pressed in a desired shape such as a lump shape to form a green compact, and thereafter the green compact was sintered under the atmospheric pressure.

EXAMPLE 1:

Oxide of zinc (ZnO) and oxide of antimony ($Sb_2O_3$) were measured to have equimolecular amounts and mixed sufficiently in a mortar to obtain a mixed powder.

Continuously, the mixture was held at a temperature of 820° C. under the atmospheric pressure for 20 hours and cooled naturally, and thereafter calcined. The sintered body which had been calcined was ground and was put into a cylindrical forming die having a diameter of about 20 mm. This was pressed under a pressure of 300 kg/cm$^2$, and was further compression-molded under a pressure of 3.5 ton/cm$^2$ by an isostatic pressing. The obtained molded body was held at a temperature of 1040° C. under the atmospheric pressure for 40 hours and cooled naturally, and thereafter a main calcination was carried out for the molded body. This is denoted as Sample No. 1.

An X-ray diffraction (XRD) was carried out for the obtained Sample ($ZnSb_2O_6$), and the structural analysis for the obtained diffraction pattern was performed. As a result, it was found that the sample showed a trirutile phase with tetragonal system having crystal lattice constants of a=4.666 Å and c=9.265 Å.

For the Sample No. 1 ($ZnSb_2O_6$), the Zeebeck coefficient and the electrical conductivity $\sigma$ were measured at various temperatures, and the power factors ($\alpha^2\sigma$) were calculated on the basis of these values, as shown in TABLE 1.

TABLE 1

| SAMPLE NO. | TEMPERATURE (K.) | POWER FACTOR (W/mK$^2$) |
|---|---|---|
| 1 | 323 | $9.9 \times 10^{-6}$ |
| | 421 | $1.2 \times 10^{-5}$ |
| | 538 | $2.1 \times 10^{-5}$ |
| | 650 | $3.5 \times 10^{-5}$ |
| | 740 | $2.8 \times 10^{-5}$ |
| | 830 | $2.8 \times 10^{-5}$ |

EXAMPLE 2:

Antimony oxide, zinc oxide, aluminum oxide, gallium oxide, indium oxide, and lead oxide were measured so that Zn in $ZnSb_2O_6$ of the sample were substituted by Al with concentrations of 12 atomic % (Sample No. 2), by Ga of 3 atomic % (Sample No. 3), by In of 1.0 atomic % (Sample No. 4), and by Pb of 1.0 atomic % (Sample No. 5), respectively, and were thereafter sintered under the same condition of the above Example 1 to obtain 4 kinds of samples containing the above elements. XRD was carried out for each sample, and consequently, it was found that each crystal phase was shown in the trirutile one. As a result of a refinement of the lattice constant of each sample, it was found that the tendency to increase or decrease of the unit cell volume of each sample by the substitution coincides with that which could be presumed from Shannon's ionic radius data (R. D. Shannon et. al. Acta Cryst. B25, 925–946 (1969)), so that mixed each metal ion was substituted as an ion in the crystal lattice. The ionic radius, and the unit cell volume calculated from the refined lattice constant, of each sample, are shown in the TABLE 6. It can be understood that substitution has been performed in each sample because the unit cell volume is increased or decreased according to the radius of the substituted ion.

For the Samples No. 2, 3, 4, and 5, the Zeebeck coefficient and the electrical conductivity $\sigma$ at various temperatures were measured, and the power factors ($\alpha^2\sigma$) were calculated on the basis of these values, as shown in TABLES 2, 3, 4, and 5.

TABLE 2

| SAMPLE NO. | TEMPERATURE (K.) | POWER FACTOR (W/mK$^2$) |
|---|---|---|
| 2 | 325 | $9.0 \times 10^{-6}$ |
| | 440 | $1.7 \times 10^{-5}$ |
| | 555 | $3.5 \times 10^{-5}$ |
| | 659 | $5.5 \times 10^{-5}$ |
| | 748 | $3.0 \times 10^{-5}$ |
| | 824 | $2.3 \times 10^{-5}$ |

TABLE 3

| SAMPLE NO. | TEMPERATURE (K.) | POWER FACTOR ($W/mK^2$) |
|---|---|---|
| 3 | 318 | $5.1 \times 10^{-5}$ |
| | 383 | $8.9 \times 10^{-5}$ |
| | 488 | $8.6 \times 10^{-5}$ |
| | 641 | $1.0 \times 10^{-4}$ |
| | 739 | $1.9 \times 10^{-4}$ |
| | 852 | $1.8 \times 10^{-4}$ |

TABLE 4

| SAMPLE NO. | TEMPERATURE (K.) | POWER FACTOR ($W/mK^2$) |
|---|---|---|
| 4 | 321 | $1.1 \times 10^{-5}$ |
| | 367 | $1.3 \times 10^{-5}$ |
| | 419 | $1.3 \times 10^{-5}$ |
| | 535 | $2.5 \times 10^{-5}$ |
| | 653 | $3.0 \times 10^{-5}$ |
| | 759 | $3.9 \times 10^{-5}$ |

TABLE 5

| SAMPLE NO. | TEMPERATURE (K.) | POWER FACTOR ($W/mK^2$) |
|---|---|---|
| 5 | 309 | $2.0 \times 10^{-6}$ |
| | 343 | $2.6 \times 10^{-6}$ |
| | 406 | $2.1 \times 10^{-6}$ |
| | 528 | $1.4 \times 10^{-5}$ |
| | 654 | $1.7 \times 10^{-5}$ |
| | 741 | $1.5 \times 10^{-5}$ |
| | 846 | $1.5 \times 10^{-5}$ |

TABLE 6

| SAMPLE NO. | ADDITIVE ION | IONIC RADIUS (Å) OCTAHEDRAL COORDINATION | UNIT CELL ($Å^3$) |
|---|---|---|---|
| 1 | — | 0.74 (Zn) | 201.72 |
| 2 | Al | 0.53 | 201.65 |
| 3 | Ga | 0.62 | 201.70 |
| 4 | In | 0.80 | 201.86 |
| 5 | Pb | 1.19 | 202.61 |

It is understood that by addition of Al, Ga, or In, each sample has a high thermoelectric performance in a wide temperature range, that is, the value of power factor of ten and several times that of a sample without such additive is obtained at each temperature, in particular, in the sample containing Ga, an enough power factor of the order of $10^{-4}$ is obtained in a wide temperature range of 300K–850K, as shown in TABLES 2–5. The sample containing Pb presents a power factor which is smaller than that of the Sample No. 1.

It should also be understood that the present invention is not limited to the above examples.

For example, the element M which may change into a divalent ion is not limited to Zn, and may be anything which has an electrical conductivity and a trirutile structure. The kind of the trace substitutive material is not limited to Li, Na, K, Al, Ga, In, Y, La, Ge, Sn, and Bi, and may be the transition elements between 21 and 29 in atomic number, rare earth elements, or other elements, and the concentration thereof may be freely selected from the range of 0.01–30.0 atomic %, so long as the figure of merit Z can be improved thereby.

In order to prepare the thermoelectric semiconductor material of the present invention, not only a sintering method which is adopted in the above embodiments but also a usual physical or chemical vapor deposition, e.g., a sputtering method, or a CVD method, a liquid deposition including a solgel method, a melting method, and the like, can be adopted. Although the thermoelectric semiconductor of the present invention may be obtained in a shape of a lump as described in the above embodiments or in a shape of a thin film, according to the kind of the growth method, it is a matter of course that the thermoelectric semiconductor material of the present invention has an excellent thermoelectric performance irrespective of the shape thereof.

Because the thermoelectric semiconductor of the present invention comprises a double oxide which contains antimony and has a trirutile structure, the thermoelectric semiconductor not only presents a large figure of merit Z at a temperature not less than the room temperature, but presents a large figure of merit Z with a good reproducibility in the temperature range of 100K to 1000K, and has a thermoelectric property which is excellent and stable in a wide temperature range.

When the double oxide contains at least one of magnesium and zinc, the double oxide can be prepared by a usual sintering method. Since the method does not require a specific atmosphere and the temperature required for sintering the double oxide is relatively low, i.e., not larger than 1200° C., in comparison with that of another ceramics, it is possible to easily form the double oxide.

When the thermoelectric material of the present invention contains at least one element selected from the group consisting of Li, Na, K, Al, Ga, In, Y, La, Ge, Sn, and Bi, as a trace substitutive material, a donor level or an acceptor level is formed, so that it is possible to control the concentration of free electrons or holes which come to be carriers. Accordingly, it is possible to control the electrical conductivity and the thermoelectric power of the material.

Accordingly, the present invention provides a thermoelectric semiconductor in a low cost which can be stably used in a wide temperature range which could not conventionally obtained.

What is claimed is:

1. A thermoelectric semiconductor member in a thermoelectric conversion device; the thermoelectric conversion device comprising at least a pair of p and n type of thermoelectric semiconductor members that are connected to each other at one end thereof and separated from each other at an other end, and at least a pair of separate electrodes mounted to the thermoelectric semiconductor members at the other end; characterized in that at least one of the pair of thermoelectric semiconductor members comprises a shaped and sintered double oxide which contains antimony and has a trirutile crystal structure, said double oxide comprising a composition that is represented by $MSb_2O_6$, wherein M represents a metal element that can be changed into a divalent ion.

2. A thermoelectric semiconductor member as claimed in claim 1, wherein the thermoelectric member further contains at least one element selected from the group consisting of zinc and magnesium.

3. A thermoelectric semiconductor member as claimed in claim 1; wherein the thermoelectric member further contains 0.01–30.0 atomic % of at least one element selected from the group consisting of lithium, sodium, potassium, aluminium, gallium, indium, yttrium, lanthanum, germanium, tin, and bismuth, as a trace substitutive material.

4. A thermoelectric semiconductor member as claimed in claim 2; wherein the thermoelectric member further contains 0.01–30.0 atomic % of at least one element selected from the group consisting of lithium, sodium, potassium, aluminium, gallium, indium, yttrium, lanthanum, germanium, tin, and bismuth, as a trace substitutive material.

5. A thermoelectric semiconductor member as claimed in claim 3, wherein concentration of the trace substitutive material is not larger than 10.0 atomic %.

6. A thermoelectric semiconductor member as claimed in claim 4, wherein concentration of the trace substitutive material is not larger than 10.0 atomic %.

7. A thermoelectric semiconductor member as claimed in claim 3, wherein concentration of the trace substitutive material is not larger than 5.0 atomic %.

8. A thermoelectric semiconductor member as claimed in claim 4, wherein concentration of the trace substitutive material is not larger than 5.0 atomic %.

9. A thermoelectric semiconductor member as claimed in claim 1; wherein the thermoelectric member further contains 0.01–30.0 atomic % of at least one element selected from the group consisting of 3d-transition elements and rare earth elements, as a trace substitutive material.

10. A thermoelectric converting method used in a thermoelectric conversion device, the thermoelectric conversion device comprising at least a pair of p and n type of thermoelectric semiconductor members that are connected to each other at one end thereof and separated from each other at an other end, and at least a pair of separate electrodes mounted to the thermoelectric semiconductor members at the other end;

the method comprising utilizing as at least one of the thermoelectric semiconductor members a material that comprises a double oxide which contains antimony and has a trirutile crystal structure, said double oxide comprising a composition that is represented by $MSb_2O_6$, wherein M represents a metal element that can be changed into a divalent ion.

11. A method according to claim 10, wherein the metal element is selected from the group consisting of zinc and magnesium.

12. A method according to claim 10, wherein the material further contains 0.1–30.0 atomic % of at least one element selected from the group consisting of lithium, sodium, potassium, aluminum, gallium, indium, yttrium, lanthanum, germanium, tin, and bismuth, as a trace substitutive material.

13. A method according to claim 11, wherein the material further contains 0.01–30.0 atomic % of at least one element selected from the group consisting of lithium, sodium, potassium, aluminum, gallium, indium, yttrium, lanthanum, germanium, tin, and bismuth, as trace substitutive material.

14. A method according to claim 12, wherein concentration of the trace substitutive material is not larger than 10.0 atomic %.

15. A method according to claim 13, wherein concentration of the trace substitutive material is not larger than 10.0 atomic %.

16. A method according to claim 12, wherein concentration of the trace substitutive material is not larger than 5.0 atomic %.

17. A method according to claim 13, wherein concentration of the trace substitutive material is not larger than 5 0 atomic %.

18. A method according to claim 10, wherein the material further contains 0.1–30.0 atomic % of at least one element selected from the group consisting of 3d-transition elements and rare earth elements, as a trace substitutive material.

19. A thermoelectric device comprising:

at least a pair of p and n type of thermoelectric semiconductor members which are connected to each other at one end thereof and separated from each other at an other end; and at least a pair of separate electrodes mounted to the thermoelectric semiconductor members at the other end;

wherein at least one of the pair of thermoelectric semiconductor members includes a thermoelectric semiconductor material, the thermoelectric semiconductor material comprising a double oxide which contains antimony and has a trirutile crystal structure, said double oxide comprising a composition that is represented by $MSb_2O_6$, wherein M represents a metal element that can be changed into a divalent ion.

20. A thermoelectric device as claimed in claim 19, wherein the thermoelectric semiconductor material further contains at least one element selected from the group consisting of zinc and magnesium.

21. A thermoelectric device as claimed in claim 19, wherein the thermoelectric semiconductor material further contains 0.01–30.0 atomic % of at least one element selected from the group consisting of lithium, sodium, potassium, aluminum, gallium, indium, yttrium, lanthanum, germanium, tin and bismuth, as a trace substitutive material.

22. A thermoelectric device as claimed in claim 20, wherein the thermoelectric semiconductor material further contains 0.01–30.0 atomic % of at least one element selected from the group consisting of lithium, sodium, potassium, aluminum, gallium, indium, yttrium, lanthanum, germanium, tin and bismuth, as a trace substitutive material.

23. A thermoelectric device as claimed in claim 21, wherein concentration of the trace substitutive material is not larger than 10.0 atomic %.

24. A thermoelectric device as claimed in claim 22, wherein concentration of the trace substitutive material is not larger than 10.0 atomic %.

25. A thermoelectric device as claimed in claim 21, wherein concentration of the trace substitutive material is not larger than 5.0 atomic %.

26. A thermoelectric device as claimed in claim 22, wherein concentration of the trace substitutive material is not larger than 5.0 atomic %.

27. A thermoelectric device as claimed in claim 19, wherein the thermoelectric semiconductor material further contains 0.01–30.0 atomic % of at least one element selected from the group consisting of 3d-transition elements and rare earth elements, as a trace substitutive material.

* * * * *